United States Patent [19]

Stella

[11] Patent Number: 4,944,014

[45] Date of Patent: Jul. 24, 1990

[54] METHOD FOR SYNTHESIZING ECHO EFFECT FROM DIGITAL SPEECH DATA

[75] Inventor: Michel G. Stella, Dallas, Tex.

[73] Assignee: Texas Instruments Incorporated, Dallas, Tex.

[21] Appl. No.: 287,830

[22] Filed: Dec. 21, 1988

[51] Int. Cl.[5] .......................... G10L 5/02; H03G 3/00

[52] U.S. Cl. .......................................... 381/51; 381/61

[58] Field of Search .............................. 381/36, 51-53, 381/61-63; 364/513.5; 434/185

[56] References Cited

U.S. PATENT DOCUMENTS 4,219,880 8/1980 Nichols ................................ 381/63
4,441,201 4/1984 Henderson et al. ................. 381/51
4,630,301 12/1986 Hohl et al. ........................... 381/63

*Primary Examiner*—Gary V. Harkcom

*Assistant Examiner*—John Merecki

*Attorney, Agent, or Firm*—William E. Hiller; N. Rhys Merrett; Mel Sharp

[57] ABSTRACT

An echo effect is synthesized in a coded digital sound signal. An input sound signal is stored as a plurality of sequential frames of similar duration, each frame (n) having characteristics including an energy (E). A delay period (d) is selected as equal to a number of time. For each frame (n) later than the duration of frames of the delay (d), the energy E(n) of the frame is compared to an attenuated energy aE(n-d) of an earlier frame (n-d), which is earlier in time than frame (n) by a number of frames equal to the delay (d). If the energy E(n) is less than the attenuated energy aE(n-d) of the earlier frame, the current frame is replaced in an output sequence with a new frame having the non-energy characteristics of the earlier frame and the attenuated energy.

11 Claims, 1 Drawing Sheet

METHOD FOR SYNTHESIZING ECHO EFFECT FROM DIGITAL SPEECH DATA

TECHNICAL FIELD OF THE INVENTION

The present invention relates in general to speech and other sound synthesizers, and more particularly relates to a method for inserting an echo effect into an encoded sound signal.

BACKGROUND OF THE INVENTION

Linear predictive coding (LPC) is a conventional technique known in the art for representing a speech signal or other sound signal. This technique allows for the digital transmission of speech at medium to low bit rates, such as 1000 to 9600 bits per second. According to the LPC technique, a speech waveform is divided into consecutive frames having equal durations. The duration of each frame is typically on the order of ten to twenty milliseconds. Each frame includes a gain value related to the energy of the frame, a pitch value representing the fundamental frequency of the voice or sound, and a set of parameters representing the speech spectrum. Different types of non-energy parameters may be used in representing a frame, with the pitch value and a plurality of digital filter reflection coefficients being standard.

Linear predictive coding separates the parameters pertaining to the spectral envelope from those related to the vocal tract excitation or pitch for each speech frame. This separation of data in turn allows modifications in pitch, speed and energy, and permits the novel effect described below.

SUMMARY OF THE INVENTION

It has been discovered that the separation of parameters inherent in linear predictive coding allows the creation of an echo-like effect. According to one aspect of the invention, a method is provided for inserting an echo into a sound signal. The method may be implemented by an apparatus which includes a memory for storing the sound signal as a plurality of sequential frames of similar duration, with each frame having an energy, a frame number, and a set of non-energy characteristics. A predetermined delay period is also stored in the memory. A computer is coupled to the memory and is operable to sequentially compare each frame number to the delay period, with the last being measured as a number of frames. If the current compared frame number is greater than the length of the delay, as measured in frames, the computer compares an attenuated energy of an earlier frame to the energy of the current frame. The current frame is separated from the earlier frame by a period of time equal to the delay period. If the attenuated energy of the earlier frame is greater than the energy of the current frame, the computer replaces the current frame with the non-energy characteristics of the earlier frame and the attenuated energy of the earlier frame. This replaced frame is then used in place of the current frame in an output frame sequence.

It is preferred that the above attenuated energy be derived from the energy of the earlier frame by multiplication with a predetermined attenuation factor that is also stored in the memory.

A principal advantage of the invention is that the replacement of a current frame with an earlier frame (with attenuated energy) causes an echo-like effect. The "echo" is produced by displacing the earlier frame forward by a predetermined number of frames, thereby simulating the reflection of a sound wave off of a surface and its return to the listener. To simulate the dissipation of the sound wave as it travels in space, the energy or amplitude of the earlier frame is attenuated while the remaining characteristics of the frame are unaffected. A loud current frame with a high energy would tend to mask out the echo. Therefore, the current frame is replaced by the earlier frame only if the energy of the earlier frame, as attenuated, is greater than the energy of the current frame.

BRIEF DESCRIPTION OF THE DRAWINGS

Further aspects of the invention and their advantages will be discerned from the following detailed description when taken in conjunction with the drawings, wherein.

DETAILED DESCRIPTION OF THE INVENTION

Figure 1:
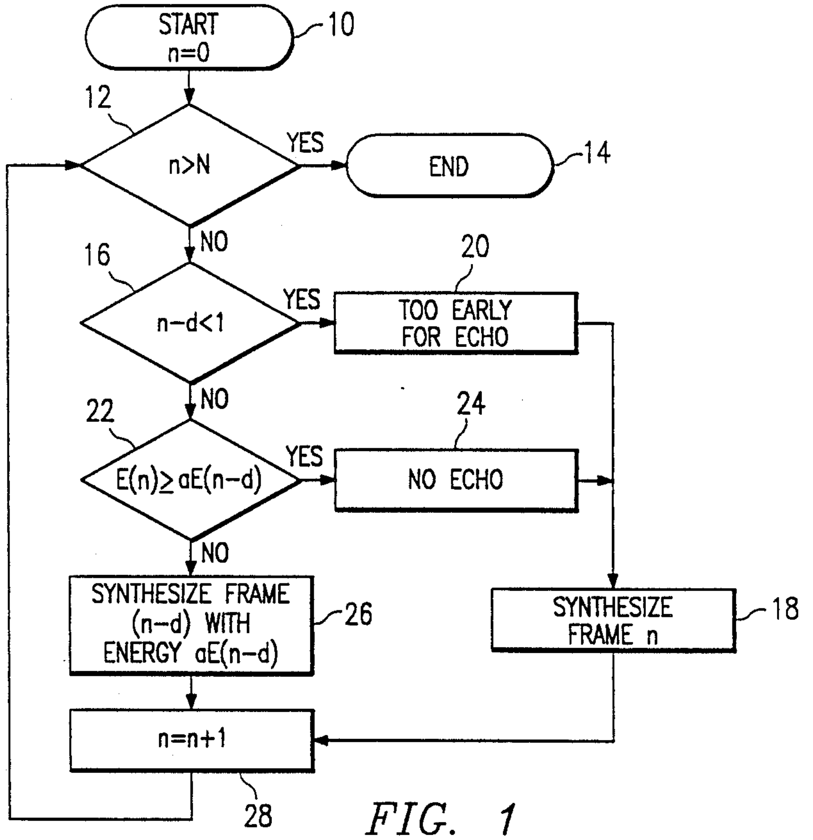
FIG. 1 is a flow diagram illustrating an echo effect generation process according to the invention.

Referring first to FIG. 1, it is assumed that a linear predictive coding (LPC) sequence of sound signal or speech signals in the form of a plurality of consecutive digital data frames is presented to the system at a beginning step 10. Prior to this step, the sequence of frames has been generated from an audio signal according to a conventional linear predictive coding technique. The sound or speech waveform is divided into a plurality of consecutive frames of equal duration which may typically range from ten to twenty milliseconds. Each of the frames is accorded a number n and has an energy or gain value E(n). Each frame also has a plurality of non-energy characteristics such as a pitch value and a plurality of digital filter reflection coefficients, with ten such coefficients being standard.

The first frame of the signal has a number $n=0$ and is the first considered in the process at 10. At step 12, n is tested against N, the number of the last frame of the sound signal. If n is larger than N, the procedure branches to its end at step 14. Otherwise, the procedure branches to step 16.

At step 16, a predetermined delay period d is read from the memory. d is measured as a number of frame periods, and is typically selected to be about five to ten frames or 100 milliseconds. Step 16 subtracts d from the current frame number n. If the result is less than one, the procedure branches to step 18 through a branch 20, the latter symbolizing the fact that the current frame n appears too early in the sequence for an echo of an earlier frame to appear. At step 18, the current frame is sent unchanged as a part of an output sequence to a speech or other sound synthesizer.

If at step 16 the difference between d and n is greater than one, the procedure branches instead to a decision step 22. At this step, the memory reads the energy E(n) of the current frame and also reads from the memory an energy E(n-d) of the earlier frame. The computer further reads an attenuation factor a from the memory and multiplies the earlier frame energy E(n-d) with it to obtain an attenuated earlier frame energy aE(n-d). Attenuation factor a is typically chosen as 0.5, or about three decibels of attenuation. In general, a and d are interrelated; the attenuation a increases as a function of distance, as does the delay period d. These two predetermined quantities are, in one embodiment, selected by the user to simulate the loudness of the echo and the distance that the original sound signal traveled.

Still at step 22, the computer next compares the current energy with the attenuated earlier energy. If the current energy is larger, indicating a loud frame, the procedure branches to step 18 through a branch 24, the latter symbolizing the fact that no echo will be heard given such a loud current frame.

If the current energy E(n) is not greater than or equal to the attenuated earlier energy aE(n-d), a new frame is inserted into an output frame sequence in place of the current frame at step 26. This new frame has all of the non-energy characteristics of the earlier frame n-d. The energy E(n-d) of the earlier frame is however replaced with an attenuated energy aE(n-d) in making up the new frame. The output frame sequence may then be sent to a synthesizer, in one embodiment in real time, where the frame is•used to generate a corresponding portion of the sound signal.

At step 28, the frame number is incremented by one and the procedure loops back to step 12. The entire input frame sequence is processed in this manner until the last frame N is reached.

Figure 2:
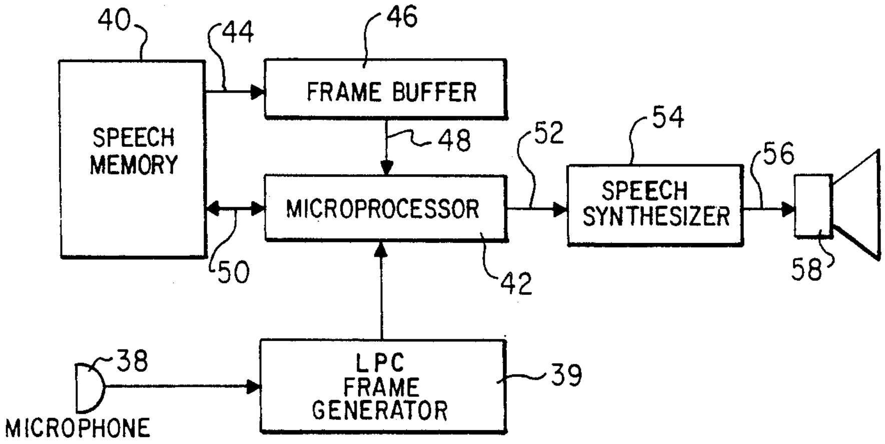
FIG. 2 is a simplified schematic block diagram of a system for inserting an echo effect into a sound frame sequence and thereafter transmitting an output sequence to a speech synthesizer.

A system for performing the echo effect insertion is schematically illustrated by the block diagram of FIG. 2. A speech memory 40 (preferably a RAM) stores the entire input sequence cf LPC frames of the sound signal to be operated upon. This stored frame sequence may come from a variety of sources. For instance, a microphone 38 may transduce an airborne soundwave such as speech into an audio signal and send the audio signal to an LPC frame generator 39. This LPC frame generator 39 may then write LPC frames to the speech memory 40 through a microprocessor 42 or other suitable circuitry. Other sources of an audio signal such as magnetic tape may also le used.

The speech memory 40 has an output 44 that is coupled to an input of a frame buffer 46. The frame buffer 46 in turn has an output 48 coupled to an input of the microprocessor 42. The microprocessor 42 has a control and data bus 50 for a bidirectional connection to the memory 40. The microprocessor 42 has an output 52 connected to a speech synthesizer 54. The speech synthesizer 54 is in turn connected by its output 56 to a speaker 58.

The microprocessor 42 should have at least an eight-bit data path. Memory 40, buffer 46, microprocessor 42 and speech synthesizer 54 may be implemented in a single IC chip similar to the Texas Instruments TSP50C4X combined microprocessor and speech synthesizer.

In operation, the microprocessor 42 has stored therein, or in a related memory unit (not shown), the attenuation factor a and the delay period d. The microprocessor sends an instruction on bus 50 to the speech memory 40 to load the frame number and energy of about the first ten frames into the frame buffer 46. If the frame number n of the first frame is less than d, the entire frame is read from the speech memory 40 by the microprocessor 42 and transmitted on its output 52 to the speech synthesizer 54. The synthesizer 54 turns the frame into an audio signal portion which is in turn transmitted on its output 56 to the speaker 58. This procedure is then repeated for the next frame.

When the current frame number n becomes larger than the delay period d, the microprocessor performs the comparison of E(n) to aE(n-d) as described at step 22 in FIG. 1. If the attenuated energy aE(n-d) is greater than the energy E(n) of the current frame, the microprocessor 42 will read the nonenergy characteristics of the earlier frame (n-d) from the speech memory 40 and, with an energy attenuated by its attenuation factor a, transmit this new frame on output 52 to the speech synthesizer 54 in place of the current frame. Otherwise, all characteristics of the current frame n are read from memory 40 and transmitted in the output frame sequence to synthesizer 54.

For all current frames n>d, the number n-d of the earlier frame and the earlier frame energy E(n-d) are deleted from the buffer 46 and the next number n+1 and its associated energy E(n+1) are loaded into buffer 46. The procedure then repeats until the last frame N has been operated on.

In summary, a process has been discovered by which an echo effect can be inserted into a speech or other sound signal encoded by linear predictive coding. While the invention and its advantages have been described in conjunction with the above exemplary detailed description, the present invention is not limited thereto but only by the scope and spirit of the appended claims.

What is claimed is:

1. A method for synthesizing an echo effect from an encoded digital speech signal, said method comprising:

- providing a plurality of consecutive speech data frames of digital speech data as coded speech parameters including an energy parameter for each frame in a sequential speech data frame sequence of frames of similar duration and representative of spoken speech;
- providing a predetermined delay period as an integer multiple of a number of speech data frame durations;
- sequentially comparing the integer multiple of the predetermined delay period with each number corresponding to consecutively numbered frames in the speech data frame sequence;
- providing the energy parameter of the current speech data frame and the energy parameter of an earlier speech data frame when the number of the current speech data frame is greater by an integer value than the integer multiple of the predetermined delay period;
- multiplying the energy parameter of the earlier speech data frame by a constant attenuation factor to provide an attenuated energy parameter;
- comparing the energy parameter of the current speech data frame with the attenuated energy parameter of the earlier speech data frame;
- replacing the current speech data frame in a speech data frame output sequence corresponding to the original order of the speech data frames in the speech data frame sequence with a new replacement speech data frame having the speech parameters of the earlier speech data frame and the attenuated energy parameter provided that the attenuated energy parameter is greater than the energy parameter of the current speech data frame;
- transmitting the speech data frame output sequence including the replacement speech data frame to a speech synthesizer;

generating an analog audio speech signal from the speech synthesizer in response to the speech data frame output sequence transmitted thereto; and producing audible synthesized speech having an echo effect provided therein from the analog audio speech signal generated by said speech synthesizer.

2. A method as set forth in claim 1, wherein the plurality of consecutive speech data frames are of equal duration.

3. A method as set forth in claim 2, wherein said coded speech parameters of each speech data frame include in addition to an energy parameter, a pitch parameter and a plurality of reflection coefficients as additional speech parameters.

4. A method as set forth in claim 1, further including subsequently providing the energy parameter of the current speech data frame and the energy parameter of a different earlier speech data frame if the attenuated energy parameter of the previous earlier speech data frame is equal to or less than the energy parameter of the current speech data frame;

multiplying the energy parameter of the different earlier speech data frame by the constant attenuation factor to provide an attenuated energy parameter;

comparing the energy parameter of the current speech data frame with the attenuated energy parameter of the different earlier speech data frame; and replacing the current speech data frame in a speech data frame output sequence corresponding to the original order of the speech data frames in the speech data frame sequence with a new replacement speech data frame having the speech parameters of the different earlier speech data frame and the attenuated energy parameter provided the attenuated energy parameter is greater than the energy parameter of the current speech data frame.

5. A method as set forth in claim 1, further including storing the plurality of speech data frames in a memory with frame numbers assigned thereto in consecutive increasing order;

storing the predetermined delay period in a memory; and thereafter comparing the integer multiple of the predetermined delay period with the number of the current speech data frame.

6. A method as set forth in claim 5, further including accessing a speech data frame sequence including a consecutive number of speech data frames from the memory; and utilizing the accessed sequence of consecutive speech data frames as the speech data frame sequence in which the echo effect is to be synthesized.

7. A method as set forth in claim 1, wherein said constant attenuation factor is 0.5.

8. A method as set forth in claim 1, wherein said delay period is five speech data frames in duration.

9. A method as set forth in claim 1, further including placing a speech data frame directly into the speech data frame output sequence for subsequent transmission to the speech synthesizer if the number of the speech data frame is not greater than the integer multiple of the predetermined delay period.

10. A method as set forth in claim 1, further including placing the current speech data frame in the speech data frame output sequence if the energy parameter of the current speech data frame is equal to or greater than the attenuated energy parameter of the earlier speech data frame.

11. A method for synthesizing an echo effect from digital speech data representative of spoken speech, said method comprising:

providing a plurality of speech data frames of equal duration in a predetermined frame sequence corresponding to the continuity of the spoken speech as encoded linear predictive speech parameters including an energy parameter and a plurality of reflection coefficient parameters indicative of the vocal tract for each speech data frame;

assigning a number in consecutive increasing order to each speech data frame included in the predetermined speech data frame sequence;

providing a predetermined delay period as an integer multiple of a number of speech data frame durations;

comparing the integer multiple of the predetermined delay period with the number of the current speech data frame;

providing the energy parameter of the current speech data frame and the energy parameter of an earlier speech data frame when the number of the current speech data frame is greater by an integer value than the integer multiple of the predetermined delay period;

multiplying the energy parameter of the earlier speech data frame by a constant attenuation factor to provide an attenuated energy parameter;

comparing the energy parameter of the current speech data frame with the attenuated energy parameter of the earlier speech data frame;

replacing the current speech data frame in a speech data frame output sequence corresponding to the original order of the speech data frames in the predetermined frame sequence with a new replacement speech data frame having the speech parameters of the earlier speech data frame and the attenuated energy parameter provided that the attenuated energy parameter is greater than the energy parameter of the current speech data frame;

transmitting the speech data frame output sequence including the replacement speech data frame to a speech synthesizer;

generating an analog audio speech signal from said speech synthesizer in response to the speech data frame output sequence transmitted thereto; and producing audible synthesized speech having an echo effect provided therein from the analog audio speech signal generated by said speech synthesizer.

* * * * *